United States Patent
Carras et al.

(10) Patent No.: US 7,593,446 B2
(45) Date of Patent: Sep. 22, 2009

(54) SINGLE-MODE DISTRIBUTED FEEDBACK SEMICONDUCTOR LASERS

(75) Inventors: Mathieu Carras, Gentilly (FR); Alfredo De Rossi, Paris (FR)

(73) Assignee: Thales (FR)

( * ) Notice: Subject to any disclaimer, the term of this patent is extended or adjusted under 35 U.S.C. 154(b) by 0 days.

(21) Appl. No.: 12/117,053

(22) Filed: May 8, 2008

(65) Prior Publication Data
US 2008/0279244 A1 Nov. 13, 2008

(30) Foreign Application Priority Data
May 11, 2007 (FR) .................................. 07 03390

(51) Int. Cl.
*H01S 5/00* (2006.01)
(52) U.S. Cl. .................................. 372/50.11; 372/50.1
(58) Field of Classification Search ................ 359/572; 372/45.012, 50.1, 50.11, 43.01, 109
See application file for complete search history.

(56) References Cited
U.S. PATENT DOCUMENTS
5,340,637 A * 8/1994 Okai et al. .................. 428/167

6,647,048 B2 * 11/2003 Evans ....................... 372/50.11
2002/0136255 A1 * 9/2002 Takayama et al. ............. 372/45
2004/0042516 A1 3/2004 Takaki et al.

FOREIGN PATENT DOCUMENTS
FR 2 863 774 6/2005

OTHER PUBLICATIONS

Hansmann, S. et al. "Variation of Coupling Coefficients by Sampled Gratings in Complex Coupled Distribution-Feedback Lasers." IEEE Journal of Selected Topics in Quantum Electronics, IEEE Service Center, Piscataway, NJ, US, vol. 1, No. 2, Jun. 1, 1995, pp. 341-345, XP000521095, ISSN: 1077-260X.

* cited by examiner

Primary Examiner—Minsun Harvey
Assistant Examiner—Tuan N. Nguyen
(74) Attorney, Agent, or Firm—Lowe Hauptman Ham & Berner, LLP

(57) ABSTRACT

The present invention relates to the field of distributed feedback semiconductor lasers. More specifically, the invention makes it possible to develop single-mode distributed feedback lasers with a production rate close to 100% using a simple and robust technology. To this end, the invention involves introducing radiative losses on just one of the two predominant modes of a DFB laser obtained by index modulation by defining a particular refractive index profile of the active area.

9 Claims, 4 Drawing Sheets

SINGLE-MODE DISTRIBUTED FEEDBACK SEMICONDUCTOR LASERS

RELATED APPLICATIONS

The present application is based on, and claims priority from, French Application Number 07 03390, filed May 11, 2007, the disclosure of which is hereby incorporated by reference herein in its entirety.

BACKGROUND OF THE INVENTION

1. Field of the invention

The present invention relates to the field of distributed feedback semiconductor lasers. More specifically, the invention makes it possible to develop single-mode distributed feedback lasers with a production rate close to 100% using a simple and robust technology.

2. Related Art

It is known that the first objective of distributed feedback is to eliminate as much as possible the secondary modes of the laser. A second objective is generally to reduce the mirror losses, that is, the losses due to the finite length of the laser cavity.

Currently, there are two main methods of producing distributed feedback (DFB) lasers.

These two known methods consist either in producing a modulation of the effective index of the active area, or in producing a modulation of the losses, also qualified as gain modulation. From a technological point of view, these methods generally rely on the etching of a network which can be buried, that is, etched after the growth of the active area but before the growth of the top waveguide of the laser, or located on the surface of the top waveguide of the laser and metallized.

The modulation of the index is theoretically preferred because it makes it possible to produce a DFB laser without increasing the losses, unlike loss modulation, normally easier to implement technologically, but the main defect of which is that it degrades the laser threshold.

Consequently, and since the common aim is to optimize the laser threshold, preference is given to a modulation of the index. However, while this method of producing DFB lasers makes it possible to eliminate a major proportion of the secondary modes, there generally remain two main modes, even in the case of a strongly coupled feedback.

Thus, to obtain a single-mode laser, other technologies are often added to that used to obtain a distributed feedback. The principle is to introduce significant additional losses on the spurious mode or modes.

The first method for obtaining a single-mode DFB laser consists in creating a feedback dominated by the optical losses. These losses are due to the absorption of the electromagnetic radiation by the constituent materials of the bottom and top waveguides of the laser. This modulation of the losses can only make it possible to have a single mode but, for the second, or side, mode rejection rates (SMSR) to be high enough, the losses introduced degrade the threshold of the laser. Furthermore, the amplitude of the optical losses that can be used to modulate the losses of the laser is very difficult to control. Finally, the optical losses systematically affect a wide area and therefore affect both DFB modes; thus, the mode that is to be prioritized is nevertheless affected.

A second technology involves introducing a defect in the etched network (buried network or metallized surface network). This defect makes it possible to favour the emergence of a predominant single mode in the middle of the prohibited band which would exist in the case of a defect-free periodic structuring. The main drawback of this technology is that it requires a large proportion of the geometrical parameters of the laser (notably length of cavities, position of mirrors, depth of networks) to be set first, because it breaks the translation invariance. Developing a laser using this technology is therefore restrictive and complex, all the more so as it is very sensitive to the accuracy of the technological implementation, and in particular the depth of the etched network.

In the prior art, there are yet other technologies with which to obtain single-mode lasers, such as the use of variable-pitch networks or the use of the distributed Bragg reflector (DBR) technology. However, these technologies, like the second technology described above, systematically impose strong geometrical constraints, making the production of lasers using these technologies more complex and sensitive.

To sum up, the main drawback of the main technologies of the prior art leading to the developing of single-mode DFB lasers lies either in the geometrical constraints that they impose, or in the degradation of the laser threshold. The faults mentioned make it difficult to control the technologies for producing single-mode DFB lasers and the production rates of such lasers according to these technologies are reduced.

SUMMARY OF THE INVENTION

In order to overcome the abovementioned drawbacks, the invention proposes introducing, at the level of the active area, a periodic network having a particular index profile, introducing radiative losses affecting only one of the two edge modes of the prohibited band, which are the two main modes remaining in a DFB laser produced by index modulation.

A use of the type of networks or structures to be introduced is described in the context of photodetectors with near-field concentration in French patent No. 2 863 774.

To this end, the subject of the invention is a semiconductor laser comprising at least:
  a substrate providing the mechanical support function,
  an active area, in which is propagated along a propagation axis a light beam having a wavelength,
  a top waveguide,
  a bottom waveguide, said active area comprising a refractive index profile $n_x$ modulated so that said refractive index $n_x$ varies periodically along the propagation axis and has a period $\Lambda$, the Fourier series breakdown of said modulated refractive index $n_x$ being expressed $$\left[ n_x = \sum_{N=1}^{\infty} \alpha_N \times \exp\left[ i \frac{2\Pi\Lambda}{N} \right] \right],$$

where N is called the Fourier order, $\alpha_N$ is the Nth order Fourier coefficient of said refractive index profile $n_x$, and i is such that $i^2 = -1$, characterized in that the period $\Lambda$ of said refractive index profile $n_x$ is such that there is an integer k greater than or equal to 1 for which the following parameter $$\left[ \frac{\int_0^\Lambda n_x \cdot \exp\left(i \frac{2\Pi\Lambda}{k} x\right) \cdot dx}{\left( \int_0^\Lambda n_x \cdot \exp\left(i \frac{2\Pi\Lambda}{2k} x\right) \cdot dx \right)^2} \right]$$

is a complex number, the imaginary part of which is less than approximately a tenth of the real part.

Advantageously, the integer k concerned is equal to 1.

Advantageously, the refractive index profile comprises periodic patterns, each comprising two pulses of equal width.

Advantageously, the laser comprises ion-doped patterns in the active area so as to provide the modulation of the refractive index of the active area.

Advantageously, the active area is made up of an integer number of periods, each comprising a stack of epitaxial layers of semiconductor materials such as InGaAs, AlInAs, GaAs, AlGaAs, InP, such that said laser is a quantum cascade laser (QCL).

Advantageously, the substrate is made of GaAs.

Advantageously, the bottom waveguide is made of a highly doped semiconductor material.

Advantageously, the bottom waveguide is made of InP.

Advantageously, the top waveguide is made of InP, or of InGaAs, or of AlGaAs.

Advantageously the active area is a stack of thin layers:
GaAs and AlGaAs,
AlInAs and GaInAs,
InAs and AlSb.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

There now follows a description of the invention in the context of a DFB laser in which two predominant modes coexist, the first located in the so-called top energy band 8, the second located in the so-called bottom energy band 9.

Figure 1:
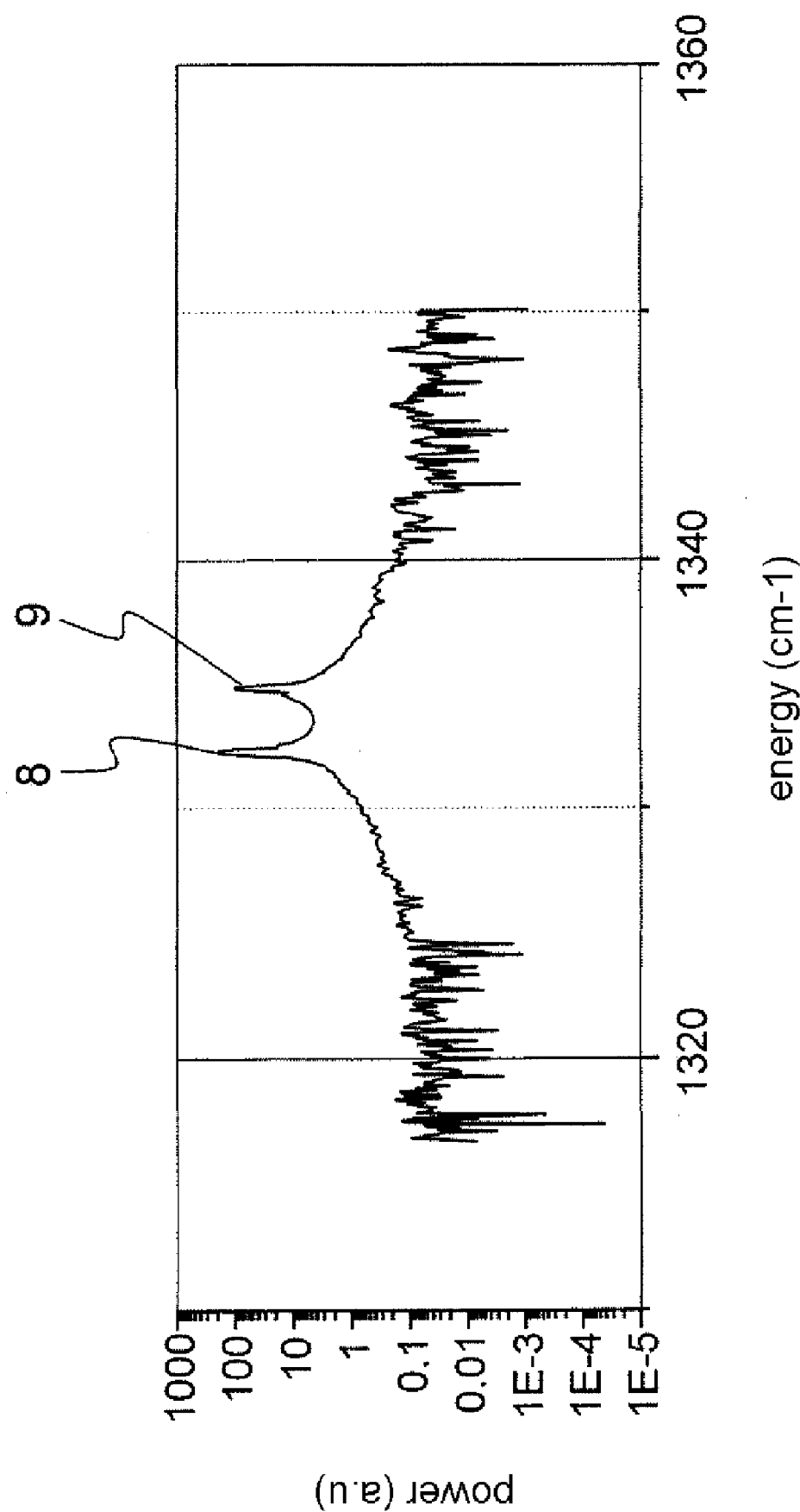
FIG. 1 represents the spectrum of a standard DFB laser with index modulation, according to the prior art.

FIG. 1 represents the spectrum of such a laser. The mode of the top band 8 has its field maxima at the level of the index maximum in the case of a modulation of the effective index of the active area 1, at the level of the bottom of the pulses in the case of a metallic network etched on the surface of the top waveguide 2 of the laser. Conversely, the mode of the bottom band 9 has its field maxima at the level of the index minimum in the case of a modulation of the effective index of the active area 1, at the level of the top of the pulses in the case of a metallic network etched on the surface of the top waveguide 2 of the laser.

The two predominant modes that coexist within the DFB laser concerned are therefore well spatially defined. It is therefore possible to introduce losses affecting only one of the two modes.

In the context of the invention, the index modulation that makes it possible to obtain a distributed feedback may have been introduced by any technological method: implantation, etching of a periodic network between the active area 1 and the top waveguide 2 or any other known or future technological method.

Figure 2:
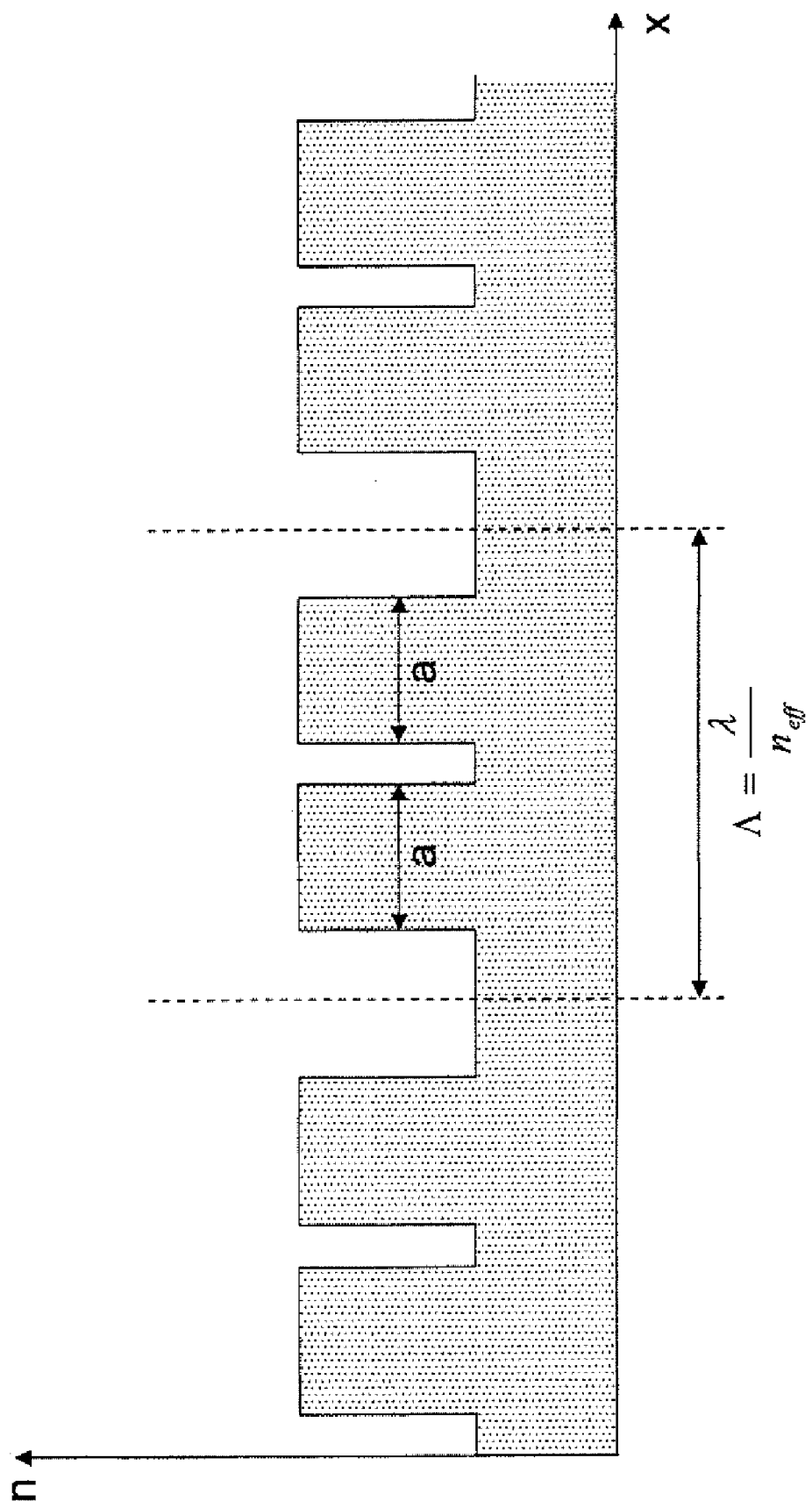
FIG. 2 represents the diagram of an exemplary index profile to be introduced to obtain a single-mode DFB laser according to the invention.

FIG. 2 presents an example of index profile to be introduced to obtain the required effect, or a single-mode DFB laser. In practice, this profile allows a radiative component to appear, which generates significant losses only for one of the two predominant modes.

Figure 3:
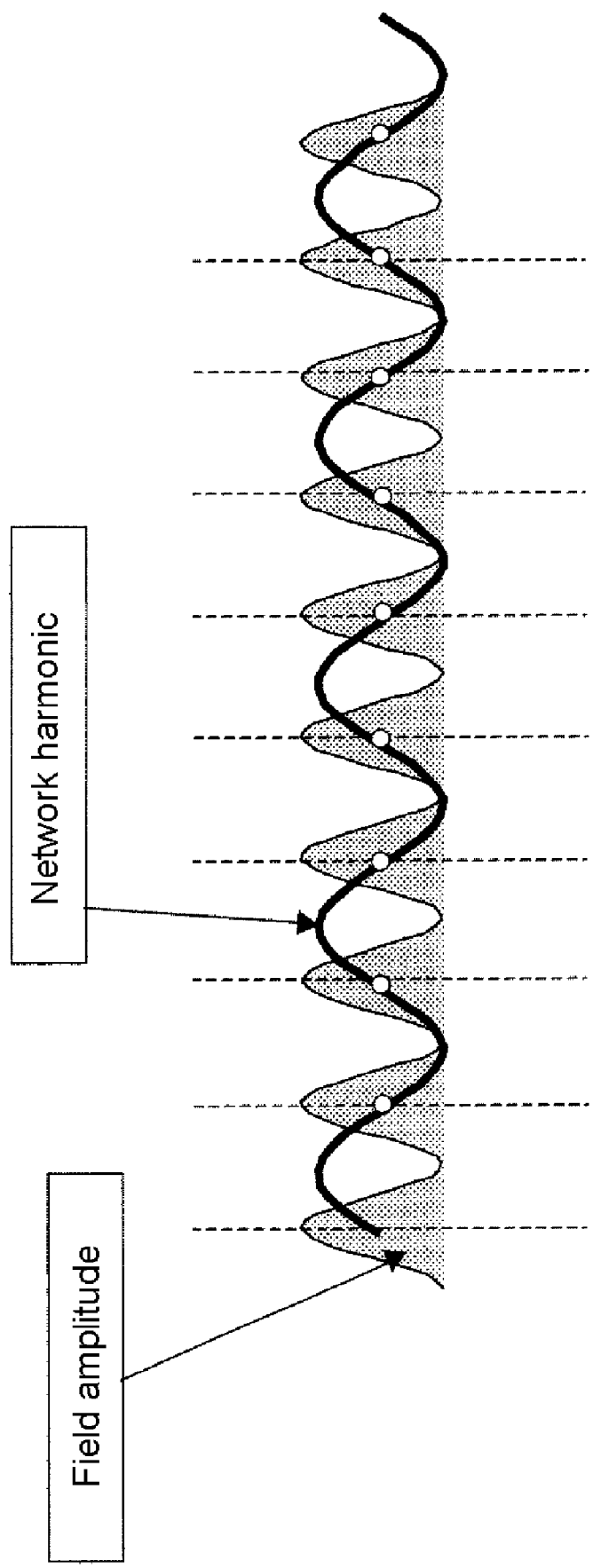
FIG. 3 represents two curves indicating the amplitude of the field of the main mode and the radiative losses generated by the index profile introduced into the laser according to the invention.
Figure 4:
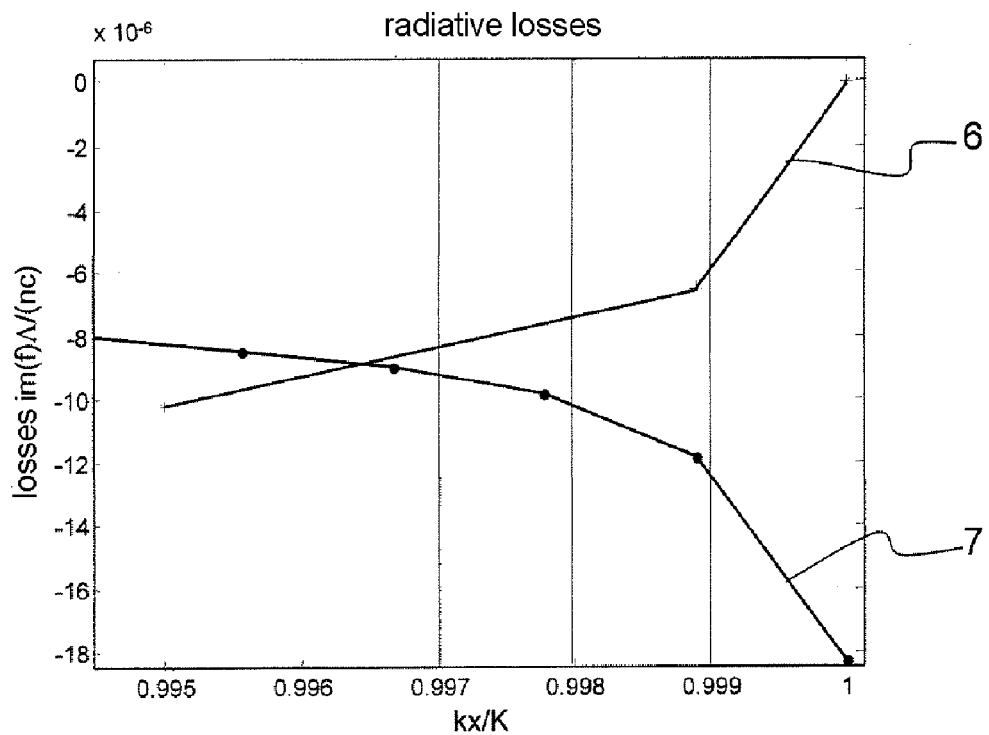
FIG. 4 shows the curve of the radiative losses produced by the index profile introduced on the bottom and top bands of the laser according to the invention.

With the profile of the pattern having been chosen with care, the losses are high for one mode, and almost zero for the other mode, as shown by FIG. 3 and FIG. 4, for which an exemplary DFB laser according to the invention has been produced with an active area 1 consisting of a stack of thin AlInAs and GaInAs layers, a bottom waveguide 3 and a top waveguide 2 of InP, and a periodic network etched according to the pattern 5 introducing an index profile as described in FIG. 2.

FIG. 3 illustrates the possibility of introducing selective radiative losses, which affect only the band that is to be eliminated. It will be observed in effect that it is possible to choose the pattern 5 of the periodic network such that the zeros of the harmonic that correspond to the radiative losses generated coincide with the maxima of the field of the mode to which these radiative losses are to be added.

FIG. 4 illustrates the selectivity of the radiative losses, expressed in the description of FIG. 3. The curves clearly indicate that it is possible to generate losses of the top band 6 that are very high and at the same time losses of the bottom band 7 that are extremely low.

Figure 5:
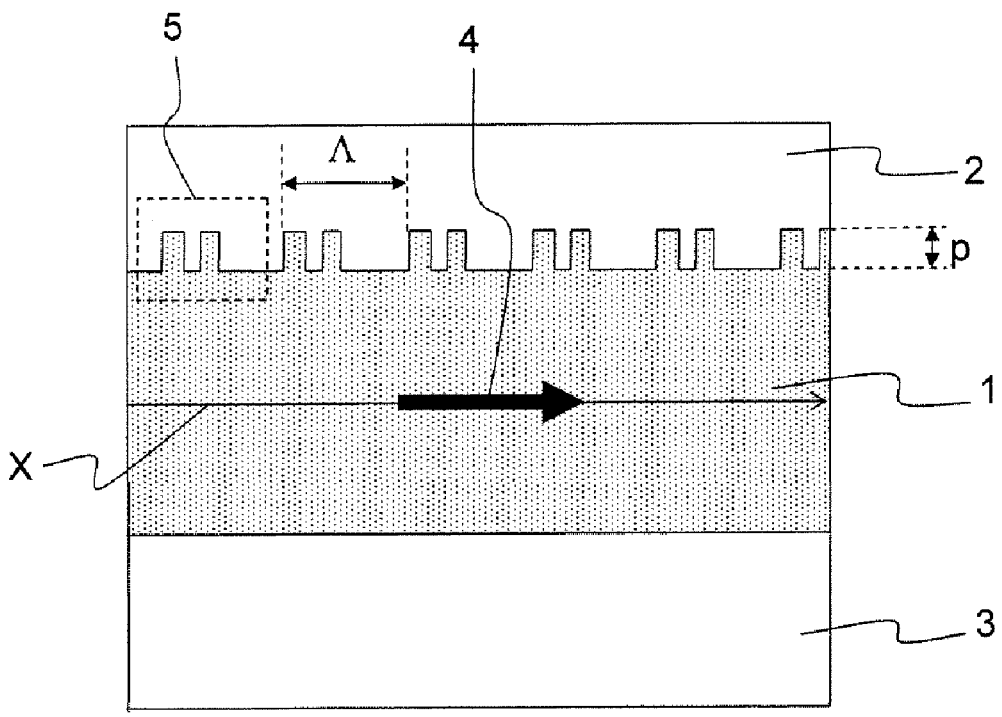
FIG. 5 is the diagrammatic illustration of an exemplary embodiment of a laser according to the invention.

FIG. 5 relates to an exemplary laser according to the invention in which there is etched, between the active area 1 and the top waveguide 2, a network of period $\Lambda$ and of depth p introducing, for the light beam 4 being propagated along the axis X, the index profile described in FIG. 2. The pattern 5 comprises two pulses of equal width. There is no strong accuracy constraint on the depth p.

To sum up, the main advantage of the invention is that it enables single-mode DFB lasers to be produced easily. Also, since the selectivity of the radiative losses is controlled, the invention makes it possible to produce these single-mode DFB lasers with a production rate close to 100%.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. Semiconductor laser comprising:
a substrate providing the mechanical support function,
an active area, in which is propagated along a propagation axis a light beam having a wavelength, a top waveguide, a bottom waveguide, said active area comprising a refractive index profile modulated so that said refractive index varies periodically along the propagation axis and has a period $\Lambda$, the Fourier series breakdown of said modulated refractive index $n_x$ being expressed $$\left[ n_x = \sum_{N=1}^{\infty} \alpha_N \times \exp\left[ i \frac{2\Pi\Lambda}{N} \right] \right],$$

where N is called the Fourier order, $\alpha_N$ is the Nth order Fourier coefficient of said refractive index profile $n_x$, and i is such that $i^2 = -1$, wherein the period $\Lambda$ of said refractive index profile $n_x$ is such that there is an integer k greater than or equal to 1 for which the following parameter $$\left[ \frac{\int_0^\Lambda n_x \cdot \exp\left( i \frac{2\Pi\Lambda}{k} x \right) \cdot dx}{\left( \int_0^\Lambda n_x \cdot \exp\left( i \frac{2\Pi\Lambda}{2k} x \right) \cdot dx \right)^2} \right]$$

is a complex number, the imaginary part of which is less than approximately a tenth of the real part;

wherein the active area is a stack of thin layers: GaAs and AlGaAs, AlInAs and GaInAs, or InAs and AlSb.

2. A laser according to claim 1, wherein the integer k concerned is equal to 1.

3. A laser according to claim 1, wherein the refractive index profile comprises periodic patterns, each comprising two pulses of equal width.

4. A laser according to claim 1, wherein it comprises ion-doped patterns in the active area so as to provide the modulation of the refractive index of the active area.

5. A laser according to claim 1, wherein the active area of said laser is made up of an integer number of periods, each period comprising a stack of epitaxial layers of semiconductor materials including InGaAs, AlInAs, GaAs, AlGaAs, InP, such that said laser is a quantum cascade laser (QCL).

6. A laser according to claim 1, wherein the substrate is made of GaAs.

7. A laser according to claim 1, wherein the bottom waveguide is made of a highly doped semiconductor material.

8. A laser according to claim 1, wherein the bottom waveguide is made of InP.

9. A laser according to claim 1, wherein the top waveguide is made of InP, or of InGaAs, or of AlGaAs.

* * * * *